(12) United States Patent
Park

(10) Patent No.: US 11,540,409 B2
(45) Date of Patent: Dec. 27, 2022

(54) TRIPLE SEALING DEVICE FOR ELECTRONICS HOUSING OF SMART INSTRUMENTATION

(71) Applicant: KEPCO ENGINEERING & CONSTRUCTION COMPANY, INC., Gimcheon-si (KR)

(72) Inventor: Ji Wung Park, Gimcheon-si (KR)

(73) Assignee: KEPCO ENGINEERING & CONSTRUCTION COMPANY, INC., Gyeongsangbuk-do (KR)

( * ) Notice: Subject to any disclaimer, the term of this patent is extended or adjusted under 35 U.S.C. 154(b) by 0 days.

(21) Appl. No.: 17/236,285

(22) Filed: Apr. 21, 2021

(65) Prior Publication Data
US 2021/0378120 A1    Dec. 2, 2021

(30) Foreign Application Priority Data

May 28, 2020    (KR) .......................... 10-2020-0064600

(51) Int. Cl.
*H05K 5/06*    (2006.01)
*H01B 17/30*    (2006.01)

(52) U.S. Cl.
CPC ............. *H05K 5/069* (2013.01); *H01B 17/30* (2013.01); *H05K 5/064* (2013.01)

(58) Field of Classification Search
CPC ....................................................... H05K 5/00
See application file for complete search history.

(56) References Cited

U.S. PATENT DOCUMENTS

| 5,613,026 | A | 3/1997 | Nagata et al. |
| 10,334,665 | B2 | 6/2019 | Kim |
| 11,018,485 | B2 | 5/2021 | Goto et al. |
| 2015/0276556 | A1* | 10/2015 | Biegner .............. G01M 17/025 73/584 |

FOREIGN PATENT DOCUMENTS

| JP | H07-281061 | 10/1995 |
| JP | H11-135983 | 5/1999 |
| JP | 2000-251975 | 9/2000 |
| JP | 2007-081047 | 3/2007 |
| JP | 2019-135732 | 8/2019 |
| JP | 2020-025025 | 2/2020 |
| KR | 10-1508724 | 4/2015 |

OTHER PUBLICATIONS

Korean Office Action, Application No. 10-2020-0064600, dated Jul. 26, 2021.

* cited by examiner

*Primary Examiner* — Jerry Wu
(74) *Attorney, Agent, or Firm* — Nixon Peabody LLP; Jeffrey L. Costellia

(57) ABSTRACT

The triple sealing device for an electronics housing of smart instrumentation includes: an electronic board; a first housing which has the electronic board disposed therein and includes a first inlet port to allow a cable to pass therethrough; a second housing which is provided above the first inlet port of the first housing and coupled to the first housing, and includes a second inlet port to allow a cable to pass therethrough; an elastic block provided on an inner circumferential surface of the second inlet port; and a cable which is connected to the electronic board and extends outward after passing through the first inlet port and the second inlet port.

4 Claims, 5 Drawing Sheets

TRIPLE SEALING DEVICE FOR ELECTRONICS HOUSING OF SMART INSTRUMENTATION

CROSS-REFERENCE TO RELATED APPLICATION

This application is based on and claims priority under 35 U.S.C. § 119 to Korean Patent Application No. 10-2020-0064600, filed on May 28, 2020, in the Korean Intellectual Property Office, the disclosure of which is incorporated by reference herein in its entirety.

BACKGROUND

1. Field

One or more embodiments relate to a triple sealing device for an electronics housing of smart instrumentation, and more particularly, to a triple sealing device for an electronics housing of smart instrumentation, in which a second housing into which a cable is inserted is provided outside a first housing in which an electronic board is disposed. Thus, it is possible to improve sealability and protect the electronic board sensitive to the environment.

2. Description of the Related Art

Since electronic boards sensitive to the environment are inserted into industrial smart instrumentation, it has to be prevented that even a small amount of water or foreign substances flow onto the electronic board. However, there are cases in industrial sites where water, foreign substances, and the like frequently flow onto the electronic board for various reasons.

Particularly, sealing may be damaged as the water or foreign substances flow into an electronics housing through a cable connected to the electronic board, and this damage to the sealing of the electronics housing may cause various limitations.

When the sealing of the electronics housing is damaged, condensed water in a wire conduit due to seasonal changes may flow into the instrumentation, and when a physical shock occurs on a cable, the cable may be detached from the electronic board.

In addition, when the sealing of the electronics housing is damaged, a spark may be generated to lead fire as dust flows in the wire conduit, and a failure may occur in the instrumentation due to the dust that has flowed in the wire conduit. Furthermore, when the sealing of the electronics housing is damaged, requirements for explosion-proof, dust-proof, waterproof, and the like are not satisfied, and thus, requirements for using smart instrumentation in industrial sites may not be satisfied.

SUMMARY

One or more embodiments include a triple sealing device for an electronics housing of smart instrumentation, in which a second housing into which a cable is inserted is provided outside a first housing in which an electronic board is disposed. Thus, it is possible to improve sealability and protect the electronic board sensitive to the environment.

Additional aspects will be set forth in part in the description which follows and, in part, will be apparent from the description, or may be learned by practice of the presented embodiments of the disclosure.

According to one or more embodiments, a triple sealing device for an electronics housing of smart instrumentation includes: an electronic board; a first housing which has the electronic board disposed therein and includes a first inlet port to allow a cable to pass therethrough; a second housing which is provided above the first inlet port of the first housing and coupled to the first housing, and includes a second inlet port to allow a cable to pass therethrough; an elastic block provided on an inner circumferential surface of the second inlet port; and a cable which is connected to the electronic board and extends outward after passing through the first inlet port and the second inlet port.

The triple sealing device may further include a cable gland which includes a hole to allow the cable to pass therethrough and is inserted into the first inlet port.

The triple sealing device may further include: a wire conduit including a hole to allow the cable to pass therethrough; and a connector including a hole to allow the cable to pass therethrough, the connector being connected to the wire conduit and the second inlet port, wherein the connector is connected to the second inlet port through a coupling.

The second housing of the triple sealing device may include a filler injection hole to allow a filler to be injected into the second housing, and wherein the cable is connected to the electronic board, and the inside of the second housing is filled with the filler after the cable extends outward through the second inlet port.

The filler of the triple sealing device may be made of an elastic material.

The filler of the triple sealing device may be made of one of a thermosetting resin, a thermoplastic resin, and an epoxy resin.

The filler of the triple sealing device may be blended with liquid and injected into the second housing, and the filler may be coagulated inside the second housing.

The triple sealing device may further include a filler injection hole cap configured to close the filler injection hole after the second housing is filled with the filler.

The second housing of the triple sealing device may be separably coupled to the first housing.

The second housing of the triple sealing device may include a plurality of separable and assemblable body portions.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
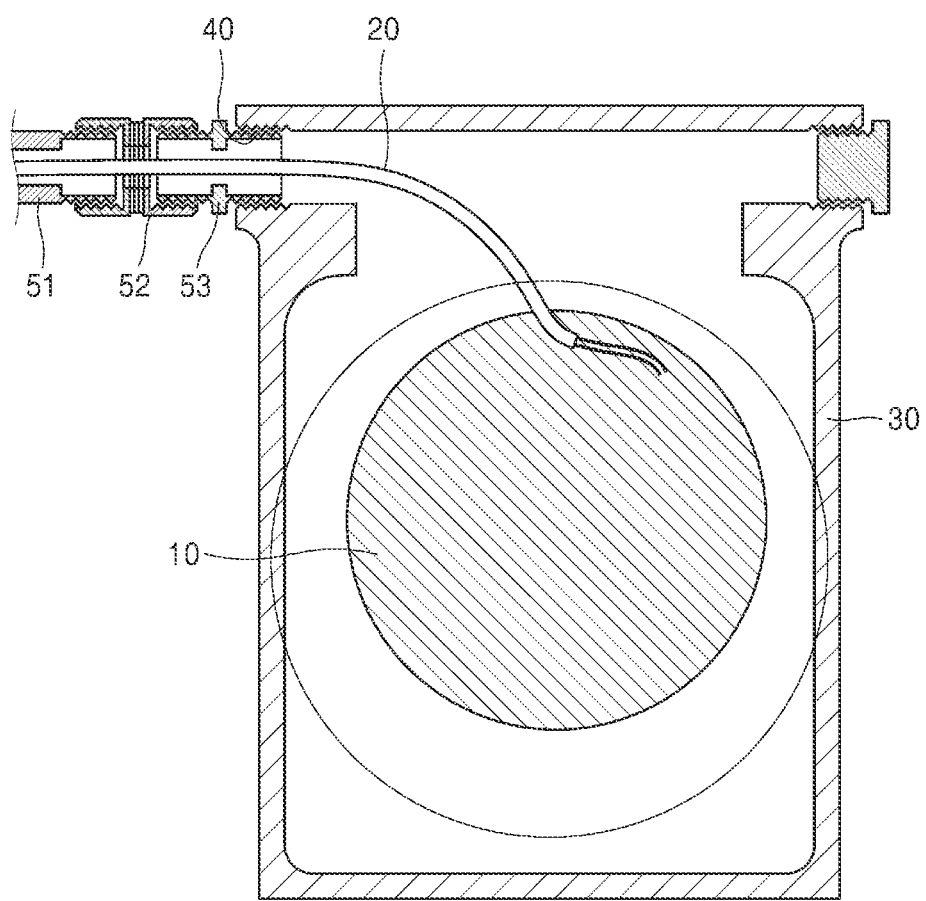
FIG. 1 is a front view of instrumentation in which a smart pressure transmitter is used.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

The present specification describes principles of the disclosure and sets forth embodiments thereof to clarify the scope of the disclosure and to allow those of ordinary skill in the art to implement the embodiments of the disclosure. The embodiments of the disclosure may have different forms.

The expression of "comprise" or "may comprise", which may be used in the various embodiments of the disclosure, indicates the presence of the relevant functions, operations, or elements in the disclosure and does not limit one or more additional functions, operations, or elements. Also, in the various embodiments of the disclosure, it will be understood that the term "includes" or "comprises", when used in this specification, specifies the presence of stated features, numbers, steps, operations, elements, components, or a combination thereof, but does not preclude the presence or addition of one or more other features, numbers, steps, operations, elements, components, or combinations thereof.

It will be understood that when an element is referred to as being "connected or coupled to" another element, the element may be directly connected or coupled to another element, or there may be an intervening element between the element and another element. On the other hand, it will be understood that when an element is referred to as being "directly connected to" or "directly coupled to" another element, there is no intervening element between the element and another element.

While such terms as first, second, etc., may be used to describe various components, such components are not limited to the above terms. Terms are only used to distinguish one component from other components.

The present disclosure relates to a triple sealing device for an electronics housing of smart instrumentation, and relates to a triple sealing device for an electronics housing of smart instrumentation, in which a second housing into which a cable is inserted is provided outside a first housing in which an electronic board is disposed. Thus, it is possible to improve sealability and protect the electronic board sensitive to the environment. Hereinafter, exemplary embodiments of the present disclosure will be described in detail with reference to the accompanying drawings.

Figure 2:
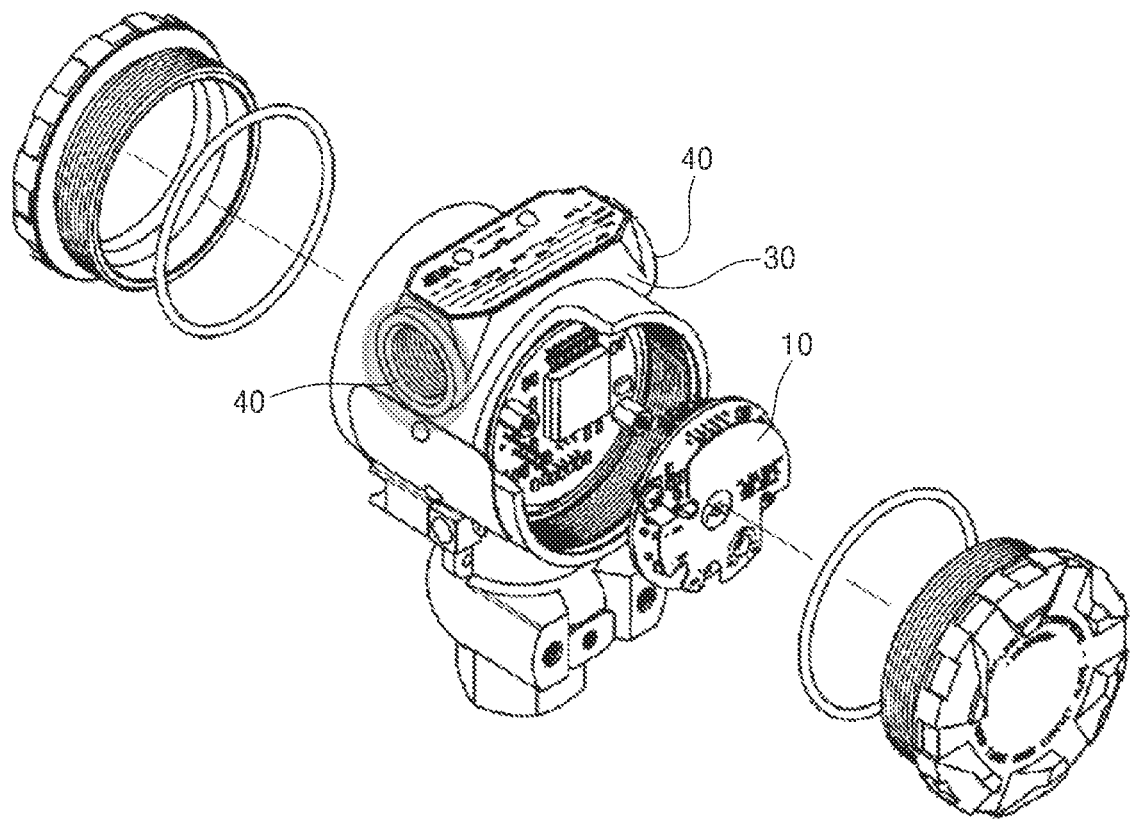
FIG. 2 is a perspective view of instrumentation in which a smart pressure transmitter is used.

FIGS. 1 and 2 are views showing instrumentation in which a smart pressure transmitter is used. Referring to FIGS. 1 and 2, an inlet port 40, through which a cable 20 is inserted, is provided in an electronics housing 30 including an electronic board 10 therein. The cable 20 may extend to the outside of the electronics housing 30 through the inlet port 40 while being connected to the electronic board 10.

A wire conduit 51 having a hole through which the cable 20 passes, a connector 52 connected to the wire conduit 51 and having a hole through which the cable 20 passes, and a coupling 53 connecting the connector 52 to the electronics housing 30 are coupled to the inlet port 40. Accordingly, the electronics housing 30 is sealed.

However, when the electronics housing 30 is sealed by the wire conduit 51, the connector 52, and the coupling 53 as described above, the sealability may become weak. Accordingly, water, foreign substances, and the like flow in the electronics housing 30 through the cable 20, and the sealability is damaged.

A triple sealing device for an electronics housing of smart instrumentation according to an embodiment of the present disclosure is made to prevent those described above. The triple sealing device for an electronics housing of smart instrumentation according to an embodiment of the present disclosure may improve the sealability of an electronics housing through: formation of primary sealing through a cable gland inserted into a first inlet port of a first housing; formation of secondary sealing through an elastic block provided in a second inlet port of a second housing; and formation of tertiary sealing through a filler filling the inside of the second housing. Now, exemplary embodiments of the present disclosure will be described in detail with reference to the accompanying drawings.

Figure 3:
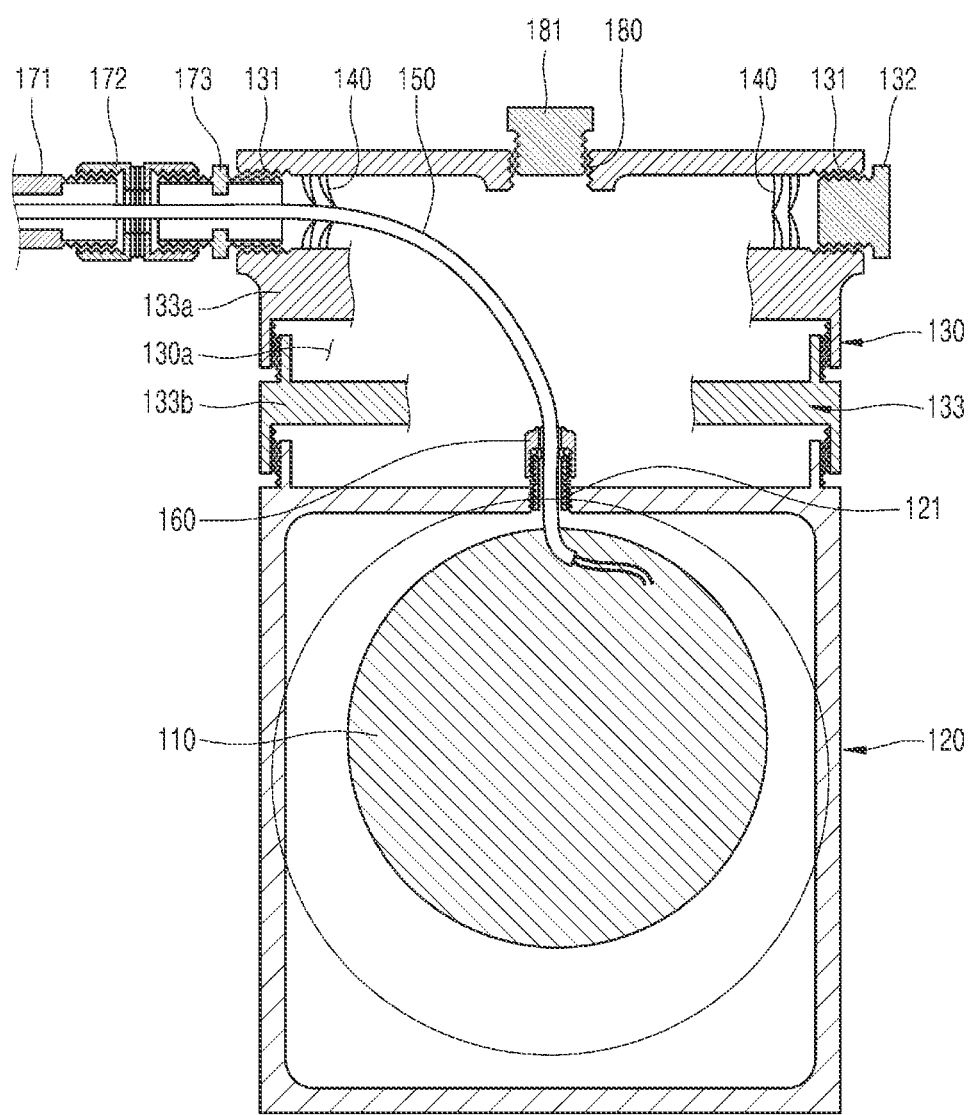
FIG. 3 is a view showing a triple sealing device for an electronics housing of smart instrumentation according to an embodiment of the present disclosure.

Referring to FIG. 3, a triple sealing device for an electronics housing of smart instrumentation according to an embodiment of the present disclosure includes an electronic board 110, a first housing 120, a second housing 130, an elastic block 140, and a cable 150.

The electronic board 110 may be an electronic board having various forms, and the electronic board 110 suitable for use in smart instrumentation may be used. The electronic board 110 is well-known in the art, and the detailed description thereof will be omitted.

The first housing 120 has the electronic board 110 disposed therein and includes a first inlet port 121 through which the cable 150 may pass. The first inlet port 121 is a hole that passes through one side of the first housing 120, and the cable 150 may be inserted into the first housing 120 through the first inlet port 121.

The electronic board 110 may be connected to the outside through the cable 150, and the cable 150 is connected to the electronic board 110 inside the first housing 120 and extends outward through the first inlet port 121.

The second housing 130 is provided above the first inlet port 121 of the first housing 120 and coupled to the first housing 120, and includes a second inlet port 131 through which the cable 150 may pass.

The second housing 130 is coupled to the first housing 120 such that an inner space 130a of the second housing 130 is positioned above the first inlet port 121 of the first housing 120. The cable 150 extending through the first inlet port 121 passes through the inner space 130a of the second housing 130.

The second inlet port 131 is a hole that passes through one side of the second housing 130, and the cable 150 may be inserted into the second housing 130 through the second inlet port 131.

A plurality of second inlet ports 131 may be provided in the second housing 130, and second inlet ports 131, through which the cable 150 does not pass, among the plurality of second inlet ports 131 may be closed by inlet port caps 132.

The second housing 130 is separably coupled to the first housing 120, and thus, the second housing 130 may be separated from the first housing 120 to connect the cable 150 to the electronic board 110 and then assembled again thereto.

The elastic block 140 may be provided on an inner circumferential surface of the second inlet port 131. The elastic block 140 may protrude inward from the inner circumferential surface of the second inlet port 131, and the elastic block 140 may be split in the center of the second inlet port 131.

The cable 150 may push the split portion of the elastic block 140, and the cable 150 may be forcibly inserted into the elastic block 140.

As the cable 150 is forcibly inserted into the elastic block 140, the sealability for peripheral regions of the cable 150 may be improved. Particularly, as the elastic block 140 is provided on the inner circumferential surface of the second inlet port 131 through which the cable 150 is inserted, water and foreign substances may be prevented from flowing in.

Also, as described below, the elastic block 140 may prevent a filler 190 filling the inside of the second housing 130 from flowing into a wire conduit 171 connected to the second inlet port 131.

The elastic block 140 may be made of a rubber block so that the water and foreign substances are blocked by the elastic block 140 to improve the sealability of the cable 150. However, an embodiment is not limited thereto, and the elastic block 140 may be made of various materials as long as the sealability for the peripheral regions of the cable 150 may be improved by forcibly inserting the cable 150.

The cable 150 may extend outward after passing through the first inlet port 121 and the second inlet port 131, and the cable 150 is connected to the electronic board 110 inside the first housing 120. The cable 150 connected to the electronic board 110 extends to the inner space 130*a* of the second housing 130 after passing through the first inlet port 121, and the cable 150, which has extended to the inner space 130*a* of the second housing 130, extends outward through the second inlet port 131.

The triple sealing device for an electronics housing of smart instrumentation according to an embodiment of the present disclosure may further include a wire conduit 171, a connector 172, and a coupling 173 which are connected to the second inlet port 131 of the second housing 130.

The wire conduit 171 includes a hole through which the cable 150 may pass, and the connector 172 is connected to the wire conduit 171 and includes a hole through which the cable 150 may pass. The connector 172 may be connected to the second inlet port 131 through the coupling 173.

When the cable 150 extends outward through the second inlet port 131 of the second housing 130, the wire conduit 171-connector 172-coupling 173 are connected to each other while coupled to the second inlet port 131.

The triple sealing device for an electronics housing of smart instrumentation according to an embodiment of the present disclosure may further include a cable gland 160 inserted into the first inlet port 121 and including a hole through which the cable 150 may pass.

The cable gland 160 may be coupled to the first inlet port 121 after the cable 150 connected to the electronic board 110 inside the first housing 120 extends outward through the first inlet port 121.

Particularly, the cable 150 passes through the first inlet port 121 and the cable gland 160 after the cable gland 160 is inserted into the first inlet port 121. Subsequently, the cable gland 160 is coupled and fixed to the first inlet port 121 as the cable gland 160 is turned.

The triple sealing device for an electronics housing of smart instrumentation according to an embodiment of the present disclosure may form primary sealing 210 through the cable gland 160. In an industrial site where smart instrumentation according to the related art is used, a cable gland may not be constructed because a cable is not allowed to be exposed to the outside. Thus, the cable is connected using a wire conduit and a connector.

However, the triple sealing device for an electronics housing of smart instrumentation according to an embodiment of the present disclosure includes the second housing 130, and thus, the cable gland 160 may be constructed.

Particularly, the cable gland 160 is constructed inside the second housing 130, and the inside of the second housing 130 is filled with a filler 190 which will be described later. Thus, it is possible to construct the cable gland 160 without the cable 150 being exposed to the outside.

As the cable gland 160 may be installed in the triple sealing device for an electronics housing of smart instrumentation according to an embodiment of the present disclosure, the primary sealing 210 for the cable 150 may be formed by the cable gland 160, and the cable gland 160 may prevent the cable 150 from being disconnected.

Figure 4:
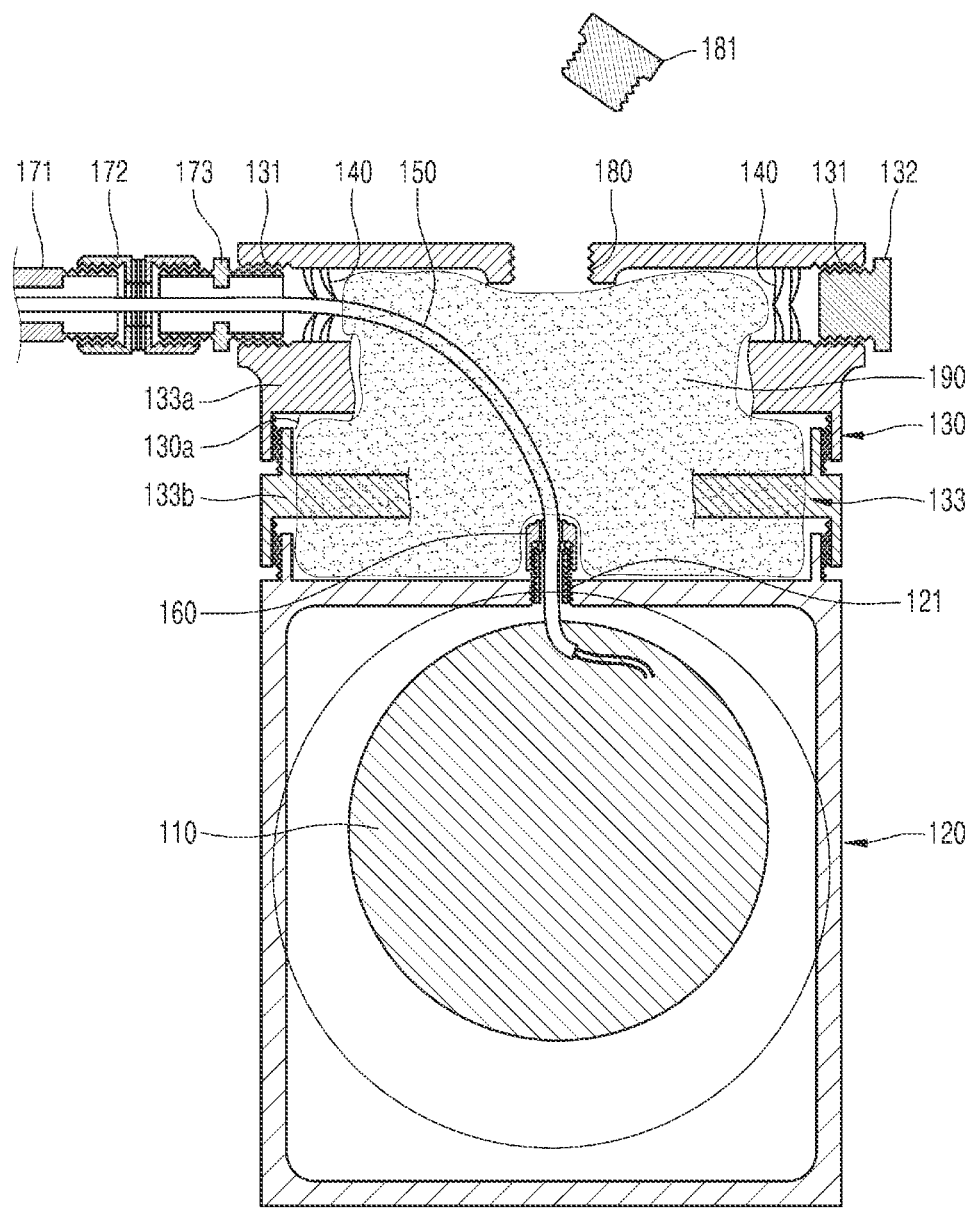
FIG. 4 is a view showing that the inside of a second housing is filled with a filler according to an embodiment of the present disclosure.

Referring to FIG. 4, a filler injection hole 180 may be provided in the second housing 130 in the triple sealing device for an electronics housing of smart instrumentation according to an embodiment of the present disclosure, and a filler 190 may be injected into the second housing 130 through the filler injection hole 180.

The sealing may be formed as the inside of the second housing 130 is filled with the filler 190. The cable 150 is connected to the electronic board 110, and the cable 150 extends outward through the first inlet port 121 of the first housing 120 and the second inlet port 131 of the second housing 130. Subsequently, the inside of the second housing 130 may be filled with the filler 190.

The filler 190 filling the inside of the second housing 130 may be made of an elastic material, and the filler 190 may be made of one of a thermosetting resin, a thermoplastic resin, and an epoxy resin. However, the material of the filler 190 is not limited thereto, but may be made of various materials as long as it may seal the second housing 130 while filling the inside of the second housing 130.

The filler 190 may be injected into the second housing 130 in a state in which the filler 190 is blended with liquid and liquefied. The filler 190 injected into the second housing 130 in the liquefied state is coagulated inside the second housing 130 and seals the inside of the second housing 130.

The triple sealing device for an electronics housing of smart instrumentation according to an embodiment of the present disclosure may further include a filler injection hole cap 181 capable of closing the filler injection hole 180.

The filler injection hole 180 is closed by the filler injection hole cap 181 after the second housing 130 is filled with the filler 190 through the filler injection hole 180, and thus, the filler 190 is prevented from flowing out of the second housing 130.

The triple sealing device for an electronics housing of smart instrumentation according to an embodiment of the present disclosure may be installed in the following method.

The second housing 130 is separably coupled to the first housing 120, and thus, the second housing 130 is separated from the first housing 120 to connect the cable 150 to the electronic board 110.

Subsequently, the cable 150 is inserted into the second inlet port 131 of the second housing 130, and the cable 150 is allowed to pass through the elastic block 140. The cable gland 160 is installed in the first inlet port 121 of the first housing 120. Here, the cable gland 160 is not in the state of being fixed, but in the state of being inserted into the first inlet port 121.

The cable 150 passing through the second inlet port 131 of the second housing 130 is allowed to pass through the cable gland 160 and the first inlet port 121. Then, the cable gland 160 is turned, and the cable gland 160 is coupled and fixed.

Subsequently, the cable 150 is connected to the electronic board 110 provided in the first housing 120. Here, the first housing 120 may include an openable cover, and the operation of connecting the cable 150 to the electronic board 110 may be performed after the cover is opened.

When the electronic board 110 and the cable 150 are connected to each other, the cable gland 160 is turned one more time and thus firmly fixed. Then, the second housing 130 is coupled to the first housing 120.

Here, the second housing 130 may include a plurality of separable and assemblable body portions 133. The size of the second housing 130 has to change depending on a place where the cable 150 is installed. To this end, the second housing 130 may include the plurality of separable and assemblable body portions 133, and the size of the second housing 130 may be adjusted by adjusting the number of the plurality of the body portions 133.

Particularly, referring to FIG. 3, the second housing 130 may include a first body portion 133*a* and a second body portion 133*b*. The second body portion 133*b* is a portion which may be coupled to the first housing 120, and the first body portion 133*a* is a portion in which the second inlet port 131 is provided.

The first body portion 133*a* and the second body portion 133*b* are separable and assemblable, and the second body portion 133*b* may be omitted as necessary. The second housing 130 is illustrated as including the first body portion 133*a* and the second body portion 133*b*, but an embodiment is not limited thereto. The body portion 133 may include two or more components.

After the second housing 130 is coupled to the first housing 120, the wire conduit 171 is connected to the second housing 130 by using the connector 172 and the coupling 173.

Subsequently, the filler injection hole cap 181 is removed to open the filler injection hole 180, and the filler 190 is inserted into the second housing 130 through the filler injection hole 180.

Here, the filler 190 may be inserted into the second housing 130 in a state in which the filler 190 is mixed with liquid and liquefied. When the liquefied filler 190 is inserted into the second housing 130, there is a risk that the liquefied filler 190 flows into the wire conduit 171.

The elastic block 140 is to prevent the risk described above, and the second inlet port 131 is closed by the elastic block 140. Thus, it is possible to prevent the liquefied filler 190 from flowing into the wire conduit 171.

When the filler 190 is coagulated, the filler injection hole 180 is closed by the filler injection hole cap 181. As described above, when the cable 150 is installed through the second housing 130, the triple sealing for the cable 150 may be formed.

Figure 5:
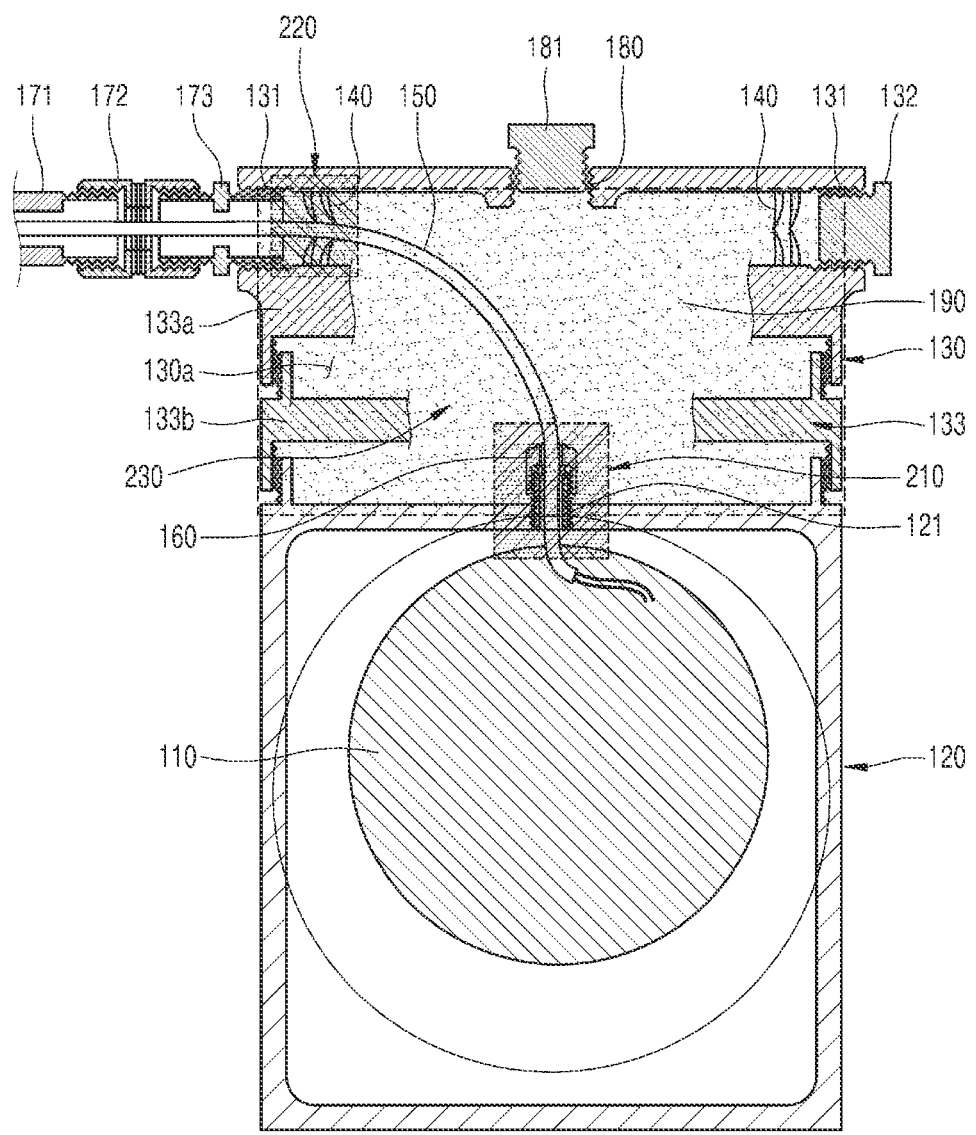
FIG. 5 is a view showing, according to an embodiment of the present disclosure, formation of primary sealing through a cable gland inserted into a first inlet port of a first housing, formation of secondary sealing through an elastic block provided in a second inlet port of a second housing, and formation of tertiary sealing through a filler filling the inside of the second housing.

Particularly, referring to FIG. 5, the triple sealing device for an electronics housing of smart instrumentation according to an embodiment of the present disclosure may form primary sealing 210 through the cable gland 160, secondary sealing 220 through the elastic block 140, and tertiary sealing 230 through the filler 190.

The triple sealing device for an electronics housing of smart instrumentation according to an embodiment of the present disclosure has the following effects.

In the triple sealing device for an electronics housing of smart instrumentation according to an embodiment of the present disclosure, the second housing 130 into which the cable 150 is inserted is provided outside the first housing 120 in which the electronic board 110 is disposed. Thus, it is possible to improve sealability and protect the electronic board 110 sensitive to the environment.

In the triple sealing device for an electronics housing of smart instrumentation according to an embodiment of the present disclosure, the primary sealing is formed through the cable gland 160 inserted into the first inlet port 121 of the first housing 120, the secondary sealing is formed through the elastic block 140 provided in the second inlet port 131 of the second housing 130, and the tertiary sealing is formed through the filler 190 filling the inside of the second housing 130. Thus, it is possible to improve the sealability of the electronics housing.

The cable gland may be constructed when the cable is exposed. However, the electronics housing for smart instrumentation according to the related art does not allow the cable to be exposed, and thus, only the wire conduit has been used without using the cable gland.

However, in the triple sealing device for an electronics housing of smart instrumentation according to an embodiment of the present disclosure, the cable gland 160 is disposed in the inner space 130*a* of the second housing 130. Thus, it is possible to install the cable gland 160 without the cable 150 being exposed to the outside.

Accordingly, in the triple sealing device for an electronics housing of smart instrumentation according to an embodiment of the present disclosure, the sealability is improved using the cable gland 160, and the cable 150 is physically firmly tightened by the cable gland 160. Thus, it is possible to prevent the cable 150 from being disconnected from the electronic board 110 when the cable 150 is pulled.

Also, in the triple sealing device for an electronics housing of smart instrumentation according to an embodiment of the present disclosure, the elastic block 140 may be used to prevent the water and foreign substances from flowing to the inside through the wire conduit. Also, the second housing 130 is filled with the filler 190, and thus, the sealability may be further improved.

In addition, in the triple sealing device for an electronics housing of smart instrumentation according to an embodiment of the present disclosure, the inflow of water, foreign substances, and the like may be independently prevented in the triple sealing manner, irrespective of the problems and conditions in a work site. Thus, the sealing may be independently maintained with respect to the inflow of foreign substances due to the abrasion of construction materials.

In the triple sealing device for an electronics housing of smart instrumentation according to an embodiment of the present disclosure, the explosion-proof function is strengthened as the sealability is improved. Also, the triple sealing device is little affected by earthquake, vibration, and physical external impacts.

The present disclosure relates to a triple sealing device for an electronics housing of smart instrumentation, and relates to the triple sealing device for an electronics housing of smart instrumentation, in which the second housing into which the cable is inserted is provided outside the first housing in which the electronic board is disposed. Thus, it is possible to improve the sealability and protect the electronic board sensitive to the environment.

According to the present disclosure, the primary sealing is formed through the cable gland inserted into the first inlet port of the first housing, the secondary sealing is formed through the elastic block provided in the second inlet port of the second housing, and the tertiary sealing is formed through the filler filling the inside of the second housing. Accordingly, it is possible to improve the sealability of the electronics housing.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A triple sealing device for an electronics housing of smart instrumentation, the triple sealing device comprising:
   an electronic board;
   a first housing which has the electronic board disposed therein and comprises a first inlet port on a top wall to allow a cable to pass therethrough;
   a bottom wall of a second housing which is provided above the first inlet port of the first housing and coupled to the top wall of the first housing, and comprises a second inlet port to allow the cable to pass therethrough;
   an elastic block provided on an inner circumferential surface of the second inlet port;
   a cable which is connected to the electronic board and extends outward after passing through the first inlet port and the second inlet port, and
   a cable gland which comprises a hole to allow the cable to pass therethrough and is inserted into the first inlet port,
   wherein the second housing comprises a filler injection hole to allow a filler to be injected into the second housing,
   wherein the cable is connected to the electronic board, and the inside of the second housing is filled with the filler after the cable extends outward through the second inlet port,
   wherein the filler is blended with liquid and injected into the second housing, and the filler is coagulated inside the second housing, further comprising a filler injection hole cap configured to close the filler injection hole after the second housing is filled with the filler,
   wherein the second housing comprises a plurality of separable and assemblable body portions, and
   wherein the second housing is separably coupled to the first housing.

2. The triple sealing device of claim 1, further comprising:
   a wire conduit comprising a hole to allow the cable to pass therethrough; and
   a connector comprising a hole to allow the cable to pass therethrough, the connector being connected to the wire conduit and the second inlet port,
   wherein the connector is connected to the second inlet port through a coupling.

3. The triple sealing device of claim 1, wherein the filler is made of an elastic material.

4. The triple sealing device of claim 1, wherein the filler is made of one of a thermosetting resin, a thermoplastic resin, and an epoxy resin.

* * * * *